United States Patent [19]

Imura

[11] 4,321,690
[45] Mar. 23, 1982

[54] MAGNETIC BUBBLE MEMORY MODULE

[75] Inventor: Ryo Imura, Hachioji, Japan

[73] Assignee: Hitachi, Ltd., Tokyo, Japan

[21] Appl. No.: 46,027

[22] Filed: Jun. 6, 1979

[30] Foreign Application Priority Data

Jun. 16, 1978 [JP] Japan .................................... 53-72158

[51] Int. Cl.³ ............................................. G11C 5/04
[52] U.S. Cl. ......................................................... 365/2
[58] Field of Search ............................................ 365/2

[56] References Cited

U.S. PATENT DOCUMENTS 4,165,536 8/1979 Layton et al. ........................... 365/2

OTHER PUBLICATIONS

IEEE Transactions on Magnetics–vol. Mag-9, No. 3 Sep. 1973 pp. 436-440.

*Primary Examiner*—James W. Moffitt
*Attorney, Agent, or Firm*—Craig and Antonelli

[57] ABSTRACT

A magnetic bubble memory module according to this invention is so constructed that heat developed by a rotating magnetic field-generating coil assembly is transmitted to linear ferrite plates of a bias magnetic field-generating device very efficiently.

Accordingly, the temperature rise of a magnetic bubble chip can be suppressed conspicuously. As a result, the service temperature range of the magnetic bubble memory can be expanded.

7 Claims, 1 Drawing Figure

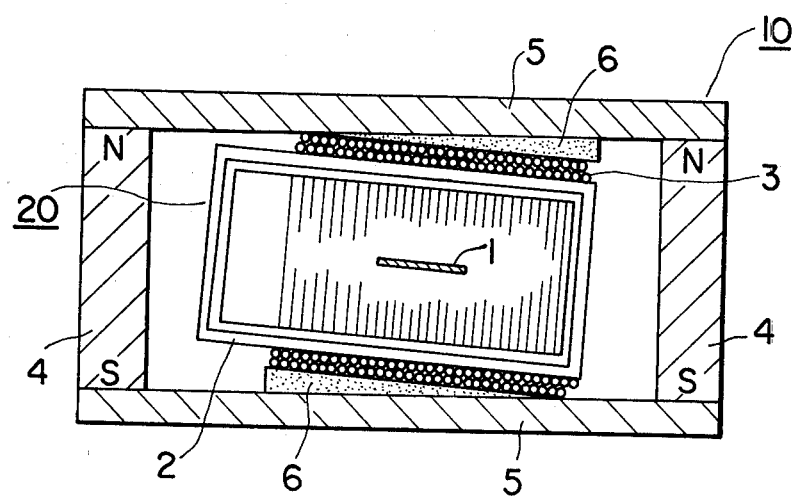

MAGNETIC BUBBLE MEMORY MODULE

FIELD OF THE INVENTION

This invention relates to magnetic bubble memory modules, and more particularly to a module structure which is improved on heat radiation for such memory modules.

DESCRIPTION OF THE PRIOR ART

Magnetic bubble memories are known to operate in a familiar field-access mode. Memories of this type are characterized by a pattern of magnetic elements, typically magnetically soft permalloy, which respond to a magnetic field rotating in a plane of bubble movement to generate a pattern of localized magnetic field gradients. A magnetic bias field, antiparallel to the magnetization of a bubble and normal to the plane of bubble movement is present to provide a range of stability over which a bubble memory is operable.

The development of such magnetic bubble memories is, at present, directed towards a stable operation in a high-speed rotating magnetic field.

In order to realize the high-speed operation of the magnetic bubble memory, a magnetic bubble chip operating at high speed needs to be developed. Simultaneously, the development of a memory module (including a rotating magnetic field-generating device and a bias magnetic field-generating device which are required for the operation of magnetic bubbles) capable of a high-speed operation is also necessary. As regards the memory module in these necessities, the temperature rise of the magnetic bubble chip attributed to the heat generation of a rotating magnetic field-generating coil is the most serious problem. This temperature rise narrows the range of bias magnetic field margins in which the magnetic bubble chip is operable. As a result, the operation of the magnetic bubble chip becomes astable.

As the frequency of the rotating magnetic field is made higher in order to realize the high-speed operation, the loss of the coil increases more. The quantity of heat generation of the coil increases in proportion to the loss. The temperature of the magnetic bubble chip rises accordingly.

Therefore, the magnetic bubble memory module of high-speed operation has the range of ambient temperatures in its use limited extremely.

SUMMARY OF THE INVENTION

It is accordingly an object of this invention to provide a magnetic bubble memory module which has a very excellent characteristic of heat radiation.

In order to accomplish the object, according to this invention, a magnetic bubble memory module is constructed of linear ferrite plates which are arranged in parallel to each other with a spacing therebetween, permanent magnets which are arranged between said linear ferrite plates and in parallel to each other with a spacing therebetween, a rotating magnetic field-generating coil assembly which consists of an inner coil and an outer coil and which is arranged aslant to said linear ferrite plates within a space enclosed with said linear ferrite plates and said permanent magnets, a magnetic bubble chip which is arranged in said rotating magnetic field-generating coil assembly, and heat transfer layers which are disposed in interspaces between said linear ferrite plates and said outer coil and which have a high electric resistance and a good thermal conductivity.

According to such characterizing construction of this invention, heat generated by the rotating magnetic field-generating coil assembly composed of the inner and outer coils is effectively transmitted to the linear ferrite plates via the heat transfer layers without staying therein. The heat transmitted to the linear ferrite plates is efficiently radiated by a heat sink mounted thereon through a magnetic shielding plate.

Accordingly, the temperature difference between the temperature of the surface of the magnetic bubble chip situated in the rotating magnetic field-generating coil assembly made up of the inner and outer coils and the temperature of the surface of the magnetic shielding plate becomes very small. As a result, the temperature rise of the magnetic bubble chip located in the rotating magnetic field-generating coil assembly is suppressed. Therefore, the magnetic bubble memory module according to this invention achieves an expanded range of ambient temperatures in its use under a high-speed operation.

BRIEF DESCRIPTION OF THE DRAWING

The single FIGURE is a sectional view of a magnetic bubble memory module constructed in accordance with this invention.

DETAILED DESCRIPTION

The drawing illustrates the sectional structure of a magnetic bubble memory module embodying this invention. A bias magnetic field-generating device 10 for maintaining the nominal diameter of magnetic bubbles consists of permanent magnet plates 4, 4 which are arranged in parallel to each other with a spacing therebetween, and linear magnetization plates 5, 5, for example, ferrite plates which are magnetically coupled with the permanent magnet plates 4, 4 and which are arranged in parallel to each other with a spacing therebetween. A uniform bias magnetic field is provided in a space which is enclosed with the permanent magnet plates 4, 4 and the linear ferrite plates 5, 5. A rotating magnetic field-generating device 20 for propagating the magnetic bubbles consists of an inner coil 2 and an outer coil 3. The inner coil 2 and the outer coil 3 are arranged in a manner to intersect orthogonally to each other. A rotating magnetic field parallel to the plane of a magnetic bubble chip (not shown) located on a substrate 1, for example, ceramic plate is generated in such a way that sinusoidal currents having a phase difference of 90° therebetween are caused to flow through the inner coil 2 and the outer coil 3 respectively. As shown in the FIGURE, the rotating magnetic field-generating device 20 having the substrate 1 is installed inside the bias magnetic field-generating device 10. As apparent from the illustration, the rotating magnetic field-generating device 20 is located in a manner to incline at a fixed angle with respect to the linear ferrite plates 5, 5 of the bias magnetic field-generating device 10. Consequently, also the substrate 1 inclines at the fixed angle with respect to the linear ferrite plates 5, 5. This fact indicates that the magnetic bubble chip placed on the substrate 1 has a bias magnetic field component parallel to the plane of the chip and a bias magnetic field component normal thereto.

The bias magnetic field component parallel to the plane of the magnetic bubble chip is usually called the "holding magnetic field". The function of the holding magnetic field is to prevent any erroneous operation of the magnetic bubbles in case of the stop-start operation of the rotating magnetic field. That is, after the rotating magnetic field has stopped, a localized magnetic field gradient (generated by the holding magnetic field) is bestowed in a fixed direction on a propagation pattern, whereby the magnetic bubble is always attracted to the particular position. The holding magnetic field is described in detail in U.S. Pat. No. 3,744,042 issued July 3, 1973.

The inclination angle stated above is approximately 1.5°. This angle is kept by heat transfer layers 6, 6 which are interposed between the linear ferrite plates 5, 5 and the outer coil 3. A feature of this invention resides in a material which constitutes the heat transfer layers 6, 6. The heat transfer layers 6, 6 function to keep the inclination angle and simultaneously to conduct heat generated by the rotating magnetic field-generating coil assembly 20. The heat conducted from the rotating magnetic field-generating coil assembly 20 to the linear ferrite plates 5, 5 by the heat transfer layers 6, 6 is transmitted to a heat sink (not shown) mounted on the linear ferrite plates 5, 5 through a magnetic shielding plate such as permalloy plate (not shown) which surrounds the bias magnetic field-generating device 10.

In a prior art, heat transfer layers are made of resin moldings. (IEEE Transactions on Magnetics Vol. Mag-13, No. 5, pp. 1373-1375, September 1977, THERMAL CHARACTERISTICS OF A FOUR-CHIP MAGNETIC BUBBLE PACKAGE)

Since, however, the resin exhibits a very low thermal conductivity, the heat generated by the rotating magnetic field-generating device cannot be satisfactorily conducted to the exterior. Metals are quite unsuitable in point of the eddy current loss.

Accordingly, the characteristics of a material required for the heat transfer layers 6, 6 are that the eddy current loss which is induced by the rotating magnetic field of high frequency is low (in other words, the electric resistance is high) and that the thermal conductivity is good. Further, it is desirable that the material be good in machinability and low in price. Such appropriate materials are semiconductors or insulators which have a thermal conductivity of at least 0.10 Cal/cm.sec/°C. and an electric resistance of $10^{-3}$-$10^{-2}\Omega$-cm. Concretely, as materials which fulfill these conditions, there are a formed plate of boron nitride and a silicon single-crystal plate. In particular, a sintered plate obtained by the thermal compression of a high purity of boron nitride is the most suitable.

As each of the inner coil 2 and the outer coil 3, a litz lead in which 28 coated copper wires having a diameter of 0.06 mm are twisted together is wound and thereafter hardened with a resin. As each heat transfer layer 6, a sintered plate of boron nitride is cut into a size of 40 mm×70 mm, whereupon it is endowed with an inclination angle of 1.5° into a wedge shape. The linear magnetization plate 5 is a ferrite plate. The magnetic bubble memory module having such construction was driven with a rotating magnetic field of 300 KHz and 50 Oe. At this time, the total quantity of heat generated by the inner coil 2 and the outer coil 3 was about 15 watts. The temperature difference between the surface temperature of the magnetic bubble chip placed on the ceramic substrate 1 and the surface temperature of the magnetic shielding plate surrounding the bias magnetic field-generating device 10 was about 12° C. In contrast, in a case where a formed plate of epoxy resin was used instead of the sintered plate of boron nitride, the temperature difference was about 21° C. This experimental result indicates that the heat transfer effect attained with the sintered plate of boron nitride is approximately twice as great as that attained with the resin.

As to the silicon single-crystal plate, substantially the same result was obtained. As compared with the sintered plate of boron nitride, however, the silicon single-crystal plate had some difficulties in price and workability.

A more enhanced heat transfer effect is achieved by a structure of the heat transfer layer to be described below.

The shape of the heat transfer layers 6, 6 is flat. The shape of the linear ferrite plates 5, 5 in contact with the heat transfer layers 6, 6 is also flat. The contact surfaces of the heat transfer layer 6 and the linear ferrite plate 5 inevitably define a slight clearance unless the respective surfaces of both the members are subjected to precision working. The clearance acts as a high resistance to heat. The same problem occurs in the contact surfaces of the heat transfer layer 6 and the outer coil 3 whose outer surface is hardened with a resin. In order to reduce the thermal resistances in these contact surfaces, grease of good thermal conductibility is applied to the contact surfaces. The grease contains powder of boron nitride having a particle diameter of approximately 0.4 μm. The magnetic bubble memory module having such construction was operated under the conditions described previously. Then, the temperature difference between the surface temperature of the magnetic bubble chip and the surface temperature of the magnetic shielding plate was about 10° C. This fact indicates that the thermal resistances of the contact surfaces are lowered still more by applying the heat conducting grease.

Further, the grease was studied experimentally. As a result, the optimum composition of the heat conducting grease contained 50-80 weight-% of boron nitride powder.

The reasons therefor are as follows. When the content of boron nitride is less than 50 weight-%, unfavorably the grease becomes fluid due to the heat. When it exceeds 80 weight-%, the grease has its caking force weakened, which is also undesirable.

The grease described above can also be applied to the interspace between the inner coil 2 and the outer coil 3. Thus, the thermal resistance between the inner coil 2 and the outer coil 3 is lowered. Accordingly, heat generated by the inner coil 2 is effectively transmitted to the linear ferrite plates 5, 5 via the outer coil 3 as well as the heat transfer layers 6, 6.

As already stated, the inner and outer coils 2, 3 are molded with the resin. Accordingly, the heat transfer is further improved by putting the powder of boron nitride into the resin.

As is apparent from the above detailed description, in the magnetic bubble memory module according to this invention, the heat transfer layers are disposed in the interspaces between the rotating magnetic field-generating device and the bias magnetic field-generating device, whereby the heat having developed in the rotating magnetic field-generating device is effectively radiated. As a result, the temperature rise of the magnetic bubble chip located in the rotating magnetic field-generating device is greatly suppressed. Accordingly, the range of ambient temperatures in the use of the magnetic bubble memory module is expanded.

I claim:

1. A magnetic bubble memory module comprising linear ferrite plates which are arranged in parallel to each other with a spacing therebetween, permanent magnets which are arranged between said linear ferrite plates and parallel to each other with a spacing therebetween, a rotating magnetic field-generating coil assembly which consists of an inner coil and an outer coil and which is arranged aslant to said linear ferrite plates within a space enclosed with said linear ferrite plates and said permanent magnets, a magnetic bubble chip which is arranged in said rotating magnetic field-generating coil assembly, and heat transfer layers which are disposed in interspaces between said linear ferrite plates and said outer coil and which have a high electric resistance and a good thermal conductivity.

2. A magnetic bubble memory module according to claim 1, wherein said each heat transfer layer is a formed plate of boron nitride.

3. A magnetic bubble memory module according to claim 1, wherein said each heat transfer layer is a silicon single-crystal plate.

4. A magnetic bubble memory module according to claim 1, wherein grease containing powder of boron nitride is interposed between contact surfaces of said linear ferrite plates and said heat transfer layers and between contact surfaces of said outer coil and said heat transfer layers.

5. A magnetic bubble memory module according to claim 4, wherein said grease contains 50-80 weight-% of boron nitride powder.

6. A magnetic bubble memory module according to claim 1, wherein
said permanent magnets are disposed orthogonally with respect to said linear ferrite plates to effect a closed magnetic loop, and
each of said heat transfer layers is in contact on a first side thereof, with said outer coil to receive heat transmitted from said coil and in contact on a second side thereof with one of said linear ferrite plates to transmit heat to said linear ferrite plate.

7. A magnetic bubble memory module according to claim 1, wherein grease-containing powder of boron nitride is interposed between contact surfaces of said linear ferrite plates and contact surfaces of said outer coil to transmit heat from said coil to said linear ferrite layers.

* * * * *